(12) United States Patent
Zheng et al.

(10) Patent No.: US 10,593,550 B2
(45) Date of Patent: Mar. 17, 2020

(54) METHOD FOR MANUFACTURING SEMICONDUCTOR STRUCTURE

(71) Applicants: Semiconductor Manufacturing International (Shanghai) Corporation, Shanghai (CN); Semiconductor Manufacturing International (Beijing) Corporation, Beijing (CN)

(72) Inventors: Erhu Zheng, Shanghai (CN); Jinhe Qi, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 15/976,125

(22) Filed: May 10, 2018

(65) Prior Publication Data

US 2018/0342393 A1    Nov. 29, 2018

(30) Foreign Application Priority Data

May 25, 2017  (CN) .......................... 2017 1 0377242

(51) Int. Cl.
| | |
|---|---|
| *H01L 21/033* | (2006.01) |
| *H01L 21/3213* | (2006.01) |
| *H01L 21/768* | (2006.01) |
| *H01L 21/311* | (2006.01) |
| *H01L 21/28* | (2006.01) |
| *H01L 21/266* | (2006.01) |

(52) U.S. Cl.
CPC ...... *H01L 21/0337* (2013.01); *H01L 21/0332* (2013.01); *H01L 21/0338* (2013.01); *H01L 21/28123* (2013.01); *H01L 21/28132* (2013.01); *H01L 21/31144* (2013.01); *H01L 21/32139* (2013.01); *H01L 21/76802* (2013.01); *H01L 21/76877* (2013.01); *H01L 21/266* (2013.01)

(58) Field of Classification Search
None
See application file for complete search history.

(56) References Cited

U.S. PATENT DOCUMENTS

| 4,406,765 A | * | 9/1983 | Higashi ................. C23C 16/515 136/258 |
| 2008/0149593 A1 | * | 6/2008 | Bai .................... H01L 21/02164 216/47 |
| 2013/0270714 A1 | * | 10/2013 | Lee .................... H01L 21/76802 257/774 |
| 2016/0218012 A1 | * | 7/2016 | Shimamoto ....... H01L 21/02164 |

* cited by examiner

*Primary Examiner* — Angel Roman
(74) *Attorney, Agent, or Firm* — Brinks Gilson & Lione

(57) ABSTRACT

This application relates to the technical field of semiconductors, and teaches methods for manufacturing a semiconductor structure. One implementation of a method includes: forming a semiconductor layer at a surface of a to-be-etched material layer on a substrate; forming an amorphous carbon layer on the semiconductor layer; forming a patterned mask layer on the amorphous carbon layer; and etching the amorphous carbon layer, the semiconductor layer, and the to-be-etched material layer using the patterned mask layer as a mask. This application may improve uniformity of the amorphous carbon layer, so that a position of a pattern that is formed after the to-be-etched material layer is etched does not deviate from an expected position, and a shape of the pattern is an expected shape.

10 Claims, 12 Drawing Sheets

METHOD FOR MANUFACTURING SEMICONDUCTOR STRUCTURE

CROSS REFERENCE TO RELATED APPLICATIONS

The present application claims priority to Chinese Patent Appln. No. 201710377242.6, filed May 25, 2017, the entire disclosure of which is hereby incorporated by reference.

BACKGROUND

Technical Field

The present application relates to the technical field of semiconductors, and in particular, to a method for manufacturing a semiconductor structure.

Related Art

Amorphous carbon has typical properties. For example, amorphous carbon has a high etching selectivity and ultraviolet absorption of a low reflectivity with respect to oxides of silicon, nitrides of silicon, and polysilicon. Therefore, amorphous carbon is widely applied to the semiconductor manufacturing process of an advance technology node. For example, the amorphous carbon may be a mask for etching a contact hole, and a mask for an etching process of gate patterning, or may be a sacrificial layer for self-aligned double patterning (SADP).

However, the inventor of this application finds that in existing applications, formed amorphous carbon has a non-uniform thickness. As a result, a pattern that is etched using the amorphous carbon as a mask cannot satisfy the requirements. For example, a position of the contact hole deviates from an expected position, and a shape of the contact hole cannot satisfy the requirements.

Therefore, it is desirable to provide a technical solution to enable improved thickness uniformity of amorphous carbon.

SUMMARY

An objective of this application is to improve thickness uniformity of an amorphous carbon layer.

According to an aspect of this application, methods for manufacturing a semiconductor structure is provided. In some implementations, a method may include: forming a semiconductor layer at a surface of a to-be-etched material layer on a substrate; forming an amorphous carbon layer on the semiconductor layer; forming a patterned mask layer on the amorphous carbon layer; and etching the amorphous carbon layer, the semiconductor layer, and the to-be-etched material layer using the patterned mask layer as a mask.

In some implementations, the semiconductor layer includes a silicon layer.

In some implementations, the silicon layer includes a monocrystalline silicon layer or an amorphous silicon layer.

In some implementations, the silicon layer is formed through a direct current superposition plasma process; the silicon layer is formed by performing an ion injection on the surface of the to-be-etched material layer; or the silicon layer is formed through an atomic layer deposition process.

In some implementations, a source gas used by the direct current superposition plasma process includes nitrogen, argon, helium, hydrogen, or a carbonyl sulfide gas.

In some implementations, the to-be-etched material layer includes an interlayer dielectric layer; and the interlayer dielectric layer is etched to form a contact hole passing through the interlayer dielectric layer.

In some implementations, the method further includes: removing the patterned mask layer; depositing a metal material to fill the contact hole; and performing a planarization process to remove a remaining amorphous carbon layer and a remaining semiconductor layer, so that an upper surface of a remaining metal material is approximately flush with an upper surface of the remaining to-be-etched material layer.

In some implementations, the to-be-etched material layer includes a gate material layer; and the gate material layer is etched to form a gate.

In some implementations, the method further includes: removing the mask layer, a remaining amorphous carbon layer, and a remaining semiconductor layer.

In some implementations, a thickness range of the semiconductor layer is 1-5 nm; and a thickness range of the amorphous carbon layer is 10-1000 nm.

According to another aspect of this application, implementations of methods for manufacturing a semiconductor structure may include: forming a semiconductor layer at a surface of a to-be-etched material layer on a substrate; forming an amorphous carbon layer on the semiconductor layer; forming a patterned first mask layer on the amorphous carbon layer; etching the amorphous carbon layer using the patterned first mask layer as a mask and using the semiconductor layer as an etch stop layer; removing the patterned first mask layer; forming a second mask layer on a side wall of a remaining amorphous carbon layer; removing the remaining amorphous carbon layer; and etching the semiconductor layer and the to-be-etched material layer by using the second mask layer as a mask.

In some implementations, the semiconductor layer includes a silicon layer.

In some implementations, the silicon layer includes a monocrystalline silicon layer or an amorphous silicon layer.

In some implementations, the silicon layer is formed through a direct current superposition plasma process; the silicon layer is formed by means of performing an ion injection on the surface of the to-be-etched material layer; or the silicon layer is formed through an atomic layer deposition.

In some implementations, a source gas used by the direct current superposition plasma process includes nitrogen, argon, helium, hydrogen, or a carbonyl sulfide gas.

In some implementations, a thickness range of the semiconductor layer is 1-5 nm; and a thickness range of the amorphous carbon layer is 10-1000 nm.

In some implementations of this application, before an amorphous carbon layer is formed, a semiconductor layer is first formed at a surface of a to-be-etched material layer, helping to improve uniformity of the amorphous carbon layer. Because the amorphous carbon layer is more uniform, a position of a mask pattern that is formed after the amorphous carbon layer is etched using a mask layer as a mask does not deviate from an expected position, and a shape of the mask pattern is also an expected shape. Further, a position of a pattern that is formed after the to-be-etched material layer is etched does not deviate from an expected position, and a shape of the pattern is an expected shape.

The exemplary embodiments and forms of this application are described in detail below with reference to the accompanying drawings, so that other features, aspects, and advantages of this application become clear.

BRIEF DESCRIPTION OF THE DRAWINGS

The accompanying drawings which constitute a part of the specification illustrate exemplary embodiments and forms of this application and, together with the specification, serve to explain the principles of this application. In the accompanying drawings.

DETAILED DESCRIPTION

Exemplary embodiments and forms of this application are described in detail with reference to the accompanying drawings. It should be understood that unless being described in detail, relative layouts, mathematical expressions, and numeric values of components and steps described in these embodiments should not be understood as a limitation to the scope of this application.

In addition, it should be understood that for ease of description, sizes of the components shown in the accompanying drawings are not necessarily drawn according to an actual proportional relationship. For example, thicknesses or widths of some layers may be magnified with respect to other layers.

The following descriptions about exemplary embodiments and forms are only illustrative, and should not be used as any limitation on this application and applications or uses of this application in any sense.

Technologies, methods, and devices that are known by a person of ordinary skill in the related fields may not be discussed in detail. However, in cases in which the technologies, methods, and devices are applicable, the technologies, methods, and devices should be considered as a part of the specification.

It should be noted that similar reference signs and letters represent similar items in the following accompanying drawings. Therefore, once an item is defined or described in a figure, the item does not need to be further discussed in the description of the subsequent figures.

The inventor of this application researches in depth a problem that the thickness of an amorphous carbon layer is non-uniform, and finds that: when forming an amorphous carbon layer on a to-be-etched material layer, different to-be-etched materials may cause differences in thickness uniformity of the amorphous carbon layer. If a semiconductor layer is formed before the amorphous carbon layer is formed, a problem that thickness uniformity of the amorphous carbon layer is worse can be improved. On this basis, the inventor provides the following technical solutions.

Figure 1:
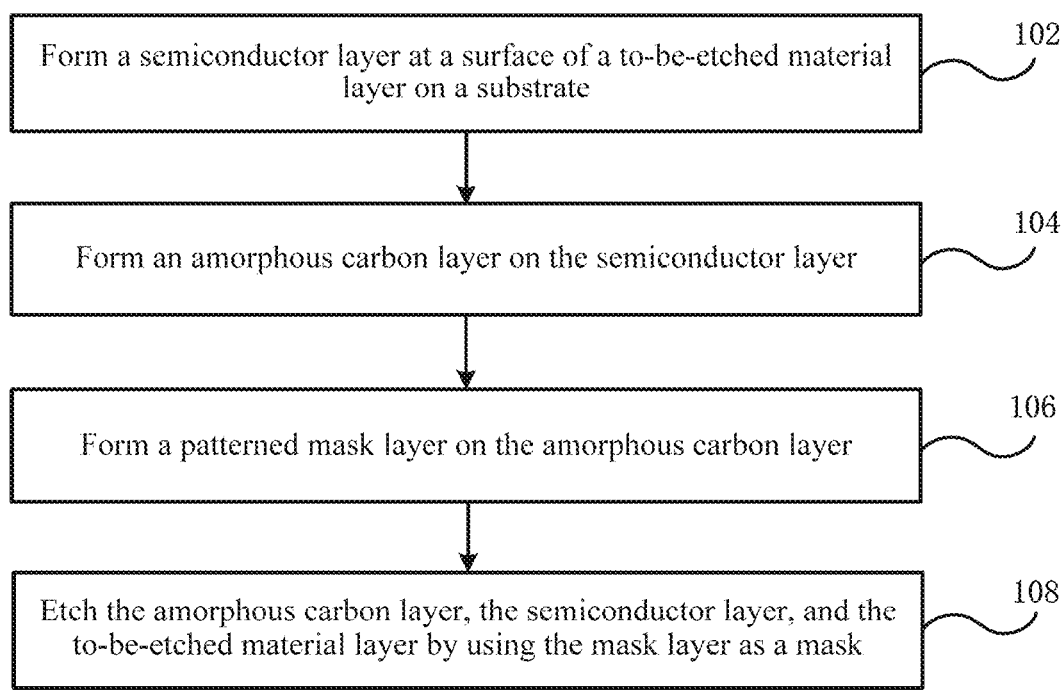
FIG. 1 is a schematic flowchart of a method for manufacturing a semiconductor structure.

FIG. 1 is a schematic flowchart of one form of a method for manufacturing a semiconductor structure.

Step 102: Form a semiconductor layer at a surface of a to-be-etched material layer on a substrate. In some implementations, the semiconductor layer may include a silicon layer.

Step 104: Form an amorphous carbon layer on the semiconductor layer.

Step 106: Form a patterned mask layer on the amorphous carbon layer. Herein, a pattern of the mask layer defines a position and a shape of a pattern that finally needs to be formed of a to-be-etched material.

Step 108: Etch the amorphous carbon layer, the semiconductor layer, and the to-be-etched material layer using the patterned mask layer as a mask. Herein, etching may be stopped in the to-be-etched material layer, or may be stopped at a surface of the substrate.

In the foregoing embodiments and forms, before an amorphous carbon layer is formed, a semiconductor layer is first formed at a surface of a to-be-etched material layer, thereby helping to improve uniformity of the amorphous carbon layer. Because the amorphous carbon layer is more uniform, a position of a mask pattern that is formed after the amorphous carbon layer is etched using a mask layer as a mask does not deviate from an expected position, and a shape of the mask pattern is also an expected shape. Further, a position of a pattern that is formed after the to-be-etched material layer is etched does not deviate from an expected position, and a shape of the pattern is an expected shape.

Two different forms are described below to separately describe the method for manufacturing a semiconductor structure shown in FIG. 1.

FIG. 2A to FIG. 2F show schematic diagrams at all phases of one form of a method for manufacturing a semiconductor structure. A to-be-etched material layer is this implementation may be an interlayer dielectric layer.

Figure 2A:
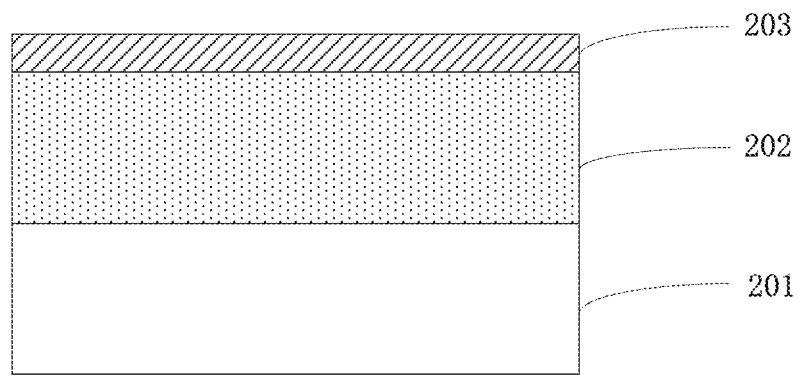
FIG. 2A to FIG. 2F show schematic diagrams at all phases of one form of a method for manufacturing a semiconductor structure.

First, as shown in FIG. 2A, a semiconductor layer 203 is formed at a surface of a to-be-etched material layer 202 on a substrate 201.

The substrate 201 may include an element semiconductor substrate such as a silicon substrate or a germanium substrate, or may include a compound semiconductor substrate such as gallium arsenide. A semiconductor device, for example, a CMOS device, may be formed in the substrate 201. The to-be-etched material layer 202 may be an interlayer dielectric layer, for example, an oxide of silicon or a nitride of silicon.

In some implementations, a thickness of the semiconductor layer 203 is small, having a thickness in the range of approximately 1-5 nm such as 2 nm or 3 nm. In some implementations, the semiconductor layer 203 may include a silicon layer. The silicon layer may be, for example, a monocrystalline silicon layer, an amorphous silicon layer, or a polysilicon layer. In some implementations, the silicon layer is a monocrystalline silicon layer or an amorphous silicon layer.

The silicon layer may be formed through different manners. Three implementations for forming the silicon layer are described below.

In some implementations, the silicon layer may be formed through a direct current superposition plasma process. In such a manner, a thinner silicon layer is easier to be formed. In some implementations, a source gas used by the direct current superposition plasma process includes nitrogen, argon, helium, hydrogen, or a carbonyl sulfide gas.

In other implementations, the silicon layer may be formed by performing an ion injection on a surface of the to-be-etched material layer 302. Herein, energy of the ion injection and dose of injected silicon may be adjusted to control the thickness of the formed silicon layer.

In still other implementations, the silicon layer may be formed through an atomic layer deposition (ALD) process.

Figure 2B:
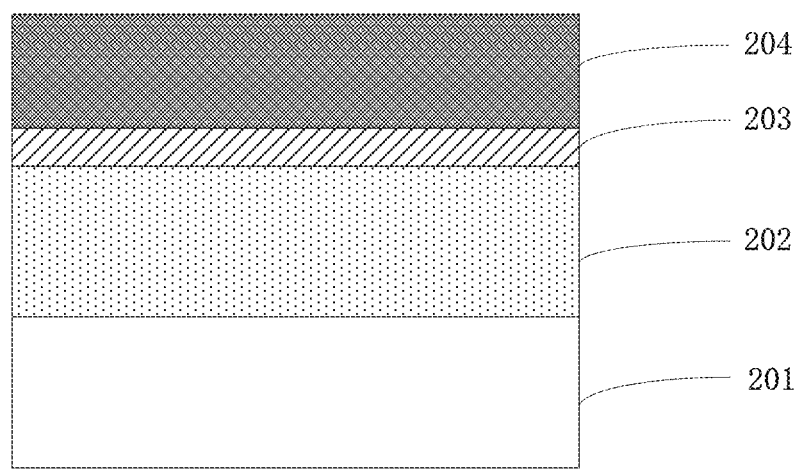

Subsequently, as shown in FIG. 2B, an amorphous carbon layer 204 is formed on the semiconductor layer 203.

For example, the amorphous carbon layer 204 may be formed through the chemical vapor deposition (CVD) or the ALD. As a further example, the amorphous carbon layer 204 may be formed in a manner of sputtering a graphite target.

A thickness range of the amorphous carbon layer 204 may be approximately 10-1000 nm with a thickness such as 30 nm, 50 nm, 100 nm, 500 nm, or 800 nm. When the thickness of the semiconductor layer 203 is approximately 1-5 nm, the thickness of the amorphous carbon layer is more uniform when the thickness is between 10-1000 nm.

Figure 2C:
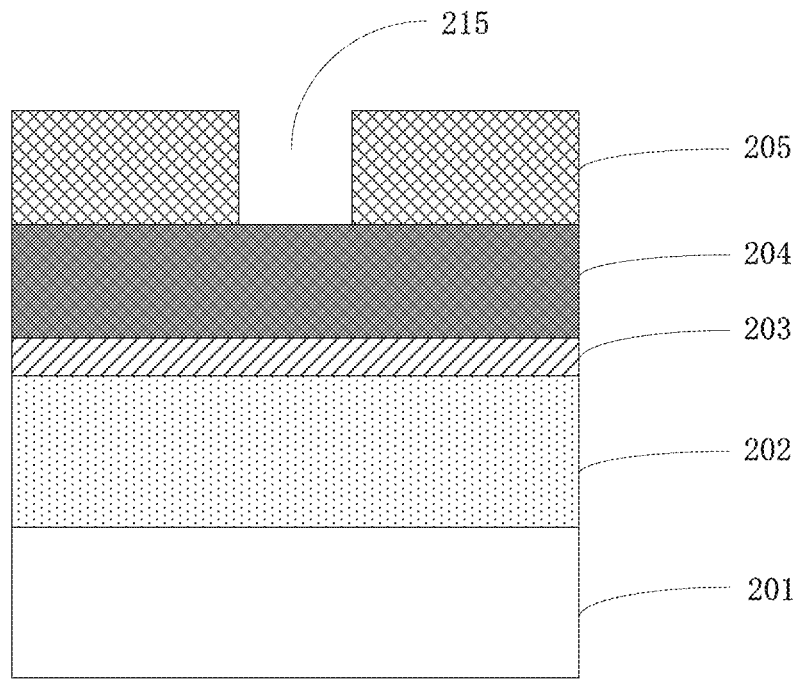

Subsequently, as shown in FIG. 2C, a patterned mask layer 205, for example, a photoresist, is formed on the amorphous carbon layer 204. Preferably, a bottom anti-reflection layer (not shown in the figure) may further be formed between the amorphous carbon layer 204 and the patterned mask layer 205. Herein, the patterned mask layer 205 has an opening 215. A position and a shape of the opening 215 define a position and a shape of a contact hole 206 that is etched later.

Figure 2D:
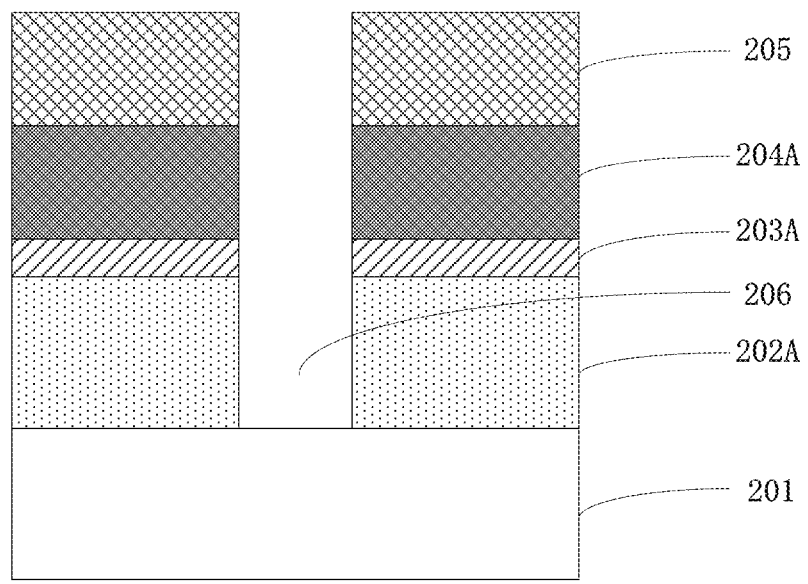

Subsequently, as shown in FIG. 2D, the amorphous carbon layer 204, the semiconductor layer 203, and the to-be-etched material layer 202 are etched by using the patterned mask layer 205 as a mask. A contact hole 206 passing through the interlayer dielectric layer is formed after the to-be-etched material layer 202, that is, the interlayer dielectric layer, is etched.

Figure 2E:
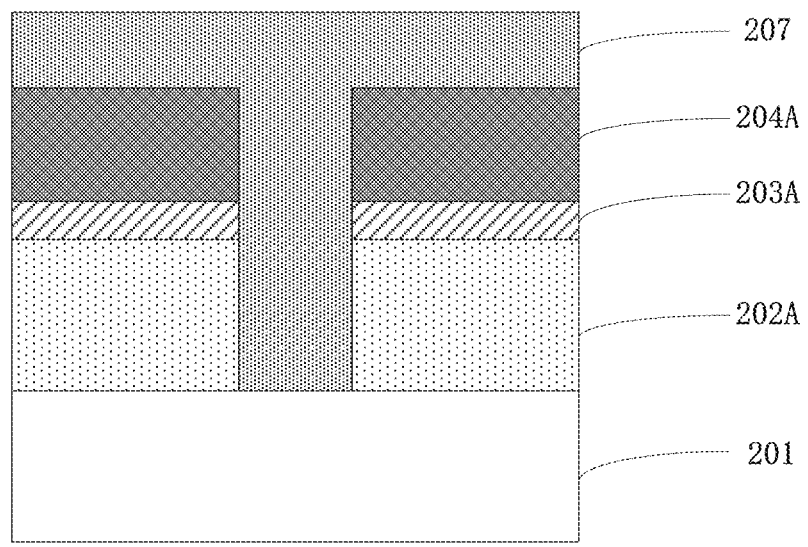

After the contact hole 206 is formed, as shown in FIG. 2E, the patterned mask layer 205 may be removed. Subsequently, a metal material 207 is deposited to fill the contact hole 206. The metal material 207 may include, for example, copper.

Figure 2F:
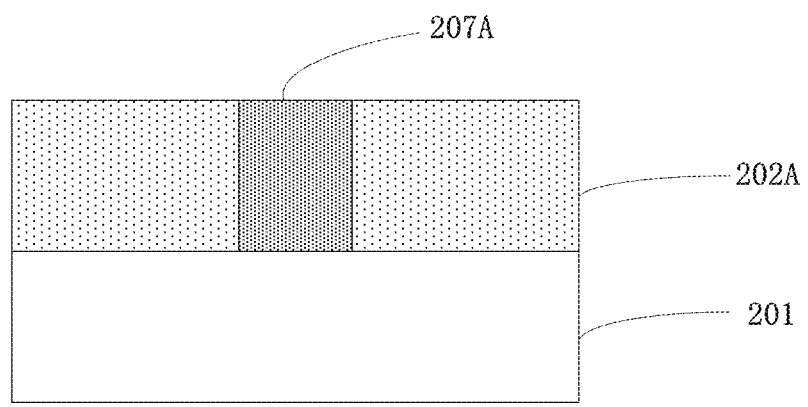

Subsequently, as shown in FIG. 2F, a planarization process, for example, a chemical mechanical planarization process, is performed to remove a remaining amorphous carbon layer 204A and a remaining semiconductor layer 203A. Therefore, an upper surface of a remaining metal material 207A approximately flushes with an upper surface of a remaining to-be-etched material layer 202A, that is, flushing within a process deviation range. In this way, a contact 207A is formed.

Forms of methods for manufacturing a semiconductor structure are described above. In forms of the manufacturing methods described above, a semiconductor layer is first formed before an amorphous carbon layer is formed, so that uniformity of the amorphous carbon layer is better. Because the amorphous carbon layer is more uniform, a position of a mask pattern that is formed after the amorphous carbon layer is etched using a mask layer as a mask does not deviate from an expected position, and a shape of the mask pattern is also an expected shape. Therefore, a position of a contact hole that is formed after a to-be-etched material layer is etched does not deviate from an expected position, and a shape of the contact hole is an expected shape. Further, a position of a contact that is formed after a metal material is filled in the contact hole does not deviate from an expected position, and a shape of the contact is an expected shape.

FIG. 3A to FIG. 3E show schematic diagrams at all phases of another form of a method for manufacturing a semiconductor structure. A to-be-etched material layer is this implementation may be a gate material layer. Only differences between this implementation and the implementations shown in FIG. 2A to FIG. 2F are mainly described below, and for other related parts, reference may be made to the foregoing descriptions.

Figure 3A:
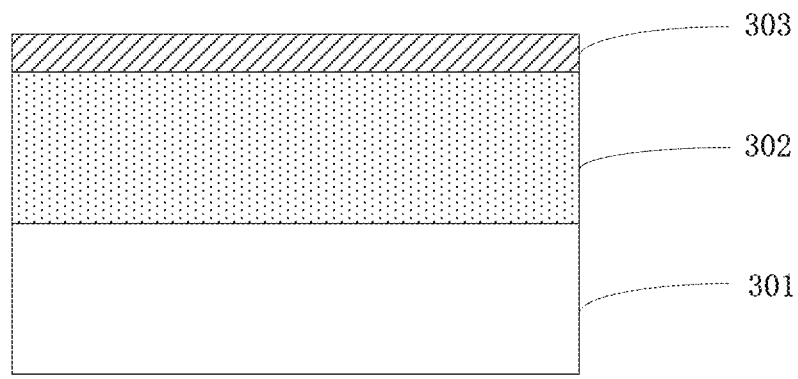
FIG. 3A to FIG. 3E show schematic diagrams at all phases of one form of a method for manufacturing a semiconductor structure.

First, as shown in FIG. 3A, a semiconductor layer 303 is formed at a surface of a to-be-etched material layer 302 on a substrate 301.

The substrate 301 may be formed with a well region, a shallow trench isolation region, and a semiconductor fin.

The to-be-etched material layer 302 may be a gate material layer, for example, polysilicon. The semiconductor layer 303 may preferably include a silicon layer, for example, a monocrystalline silicon layer or an amorphous silicon layer. For manners of forming the silicon layer, reference may be made to the foregoing descriptions, and details are not described herein again.

Figure 3B:
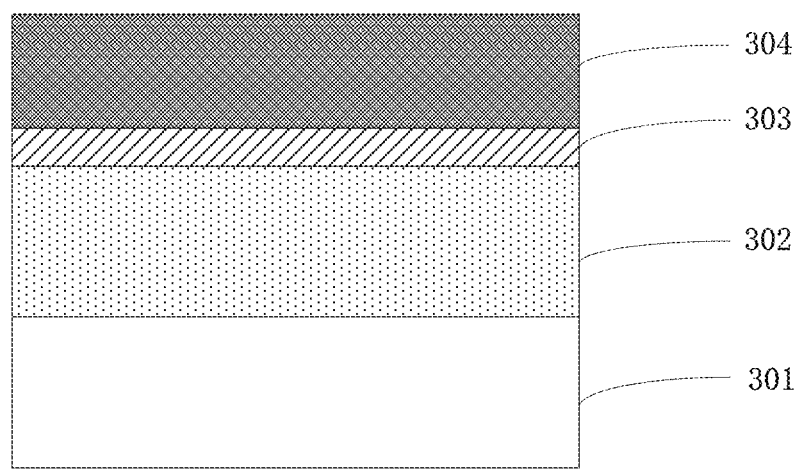

Subsequently, as shown in FIG. 3B, an amorphous carbon layer 304 is formed on the semiconductor layer 303.

Figure 3C:
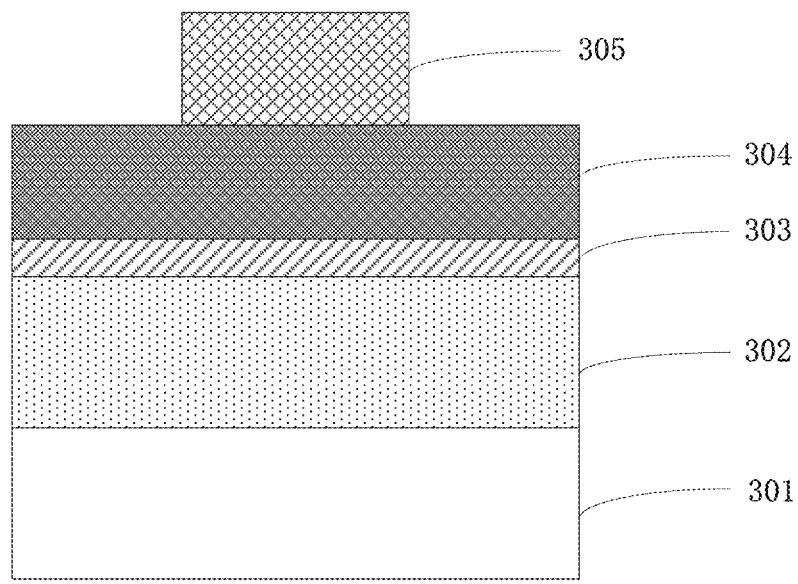

Subsequently, as shown in FIG. 3C, a patterned mask layer 305, for example, a photoresist, is formed on the amorphous carbon layer 304. Herein, a position and a shape of the patterned mask layer 305 define a position and a shape of a gate 302A that is etched later.

Figure 3D:
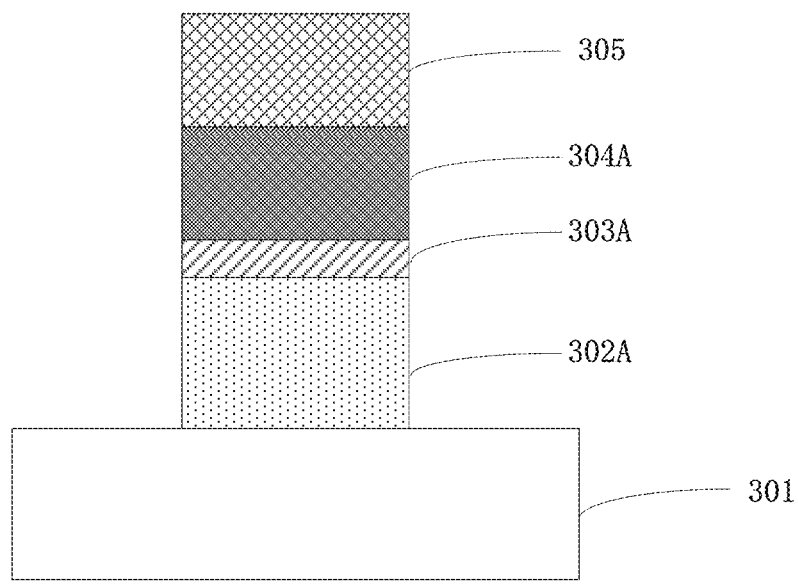

Subsequently, as shown in FIG. 3D, the amorphous carbon layer 304, the semiconductor layer 303, and the to-be-etched material layer 302 are etched using the patterned mask layer 305 as a mask. The gate 302A is formed after the to-be-etched material layer 302, that is, the gate material layer, is etched.

Figure 3E:
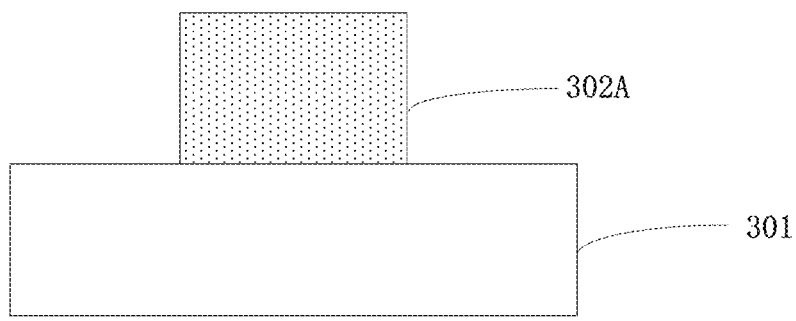

Subsequently, as shown in FIG. 3E, the patterned mask layer 305, a remaining amorphous carbon layer 304A, and a remaining semiconductor layer 303A may optionally be removed.

Forms of a method for manufacturing a semiconductor structure are described above. In forms of the manufacturing methods described above, a semiconductor layer is first formed before an amorphous carbon layer is formed, so that uniformity of the amorphous carbon layer is better. Because the amorphous carbon layer is more uniform, a position of a mask pattern that is formed after the amorphous carbon layer is etched by using a mask layer as a mask does not deviate from an expected position, and a shape of the mask pattern is also an expected shape. Therefore, a position of a gate that is formed after a to-be-etched material layer is etched does not deviate from an expected position, and a shape of the gate is an expected shape.

It should be noted that although forms of methods for manufacturing a semiconductor structure are described above in examples that the to-be-etched material layer is an interlayer dielectric layer and a gate material layer, this is not intended to limit the scope of this application.

It should be understood that in other embodiments and forms, the to-be-etched material layer may also be other materials to be etched, such as materials not listed in this application.

Figure 4:
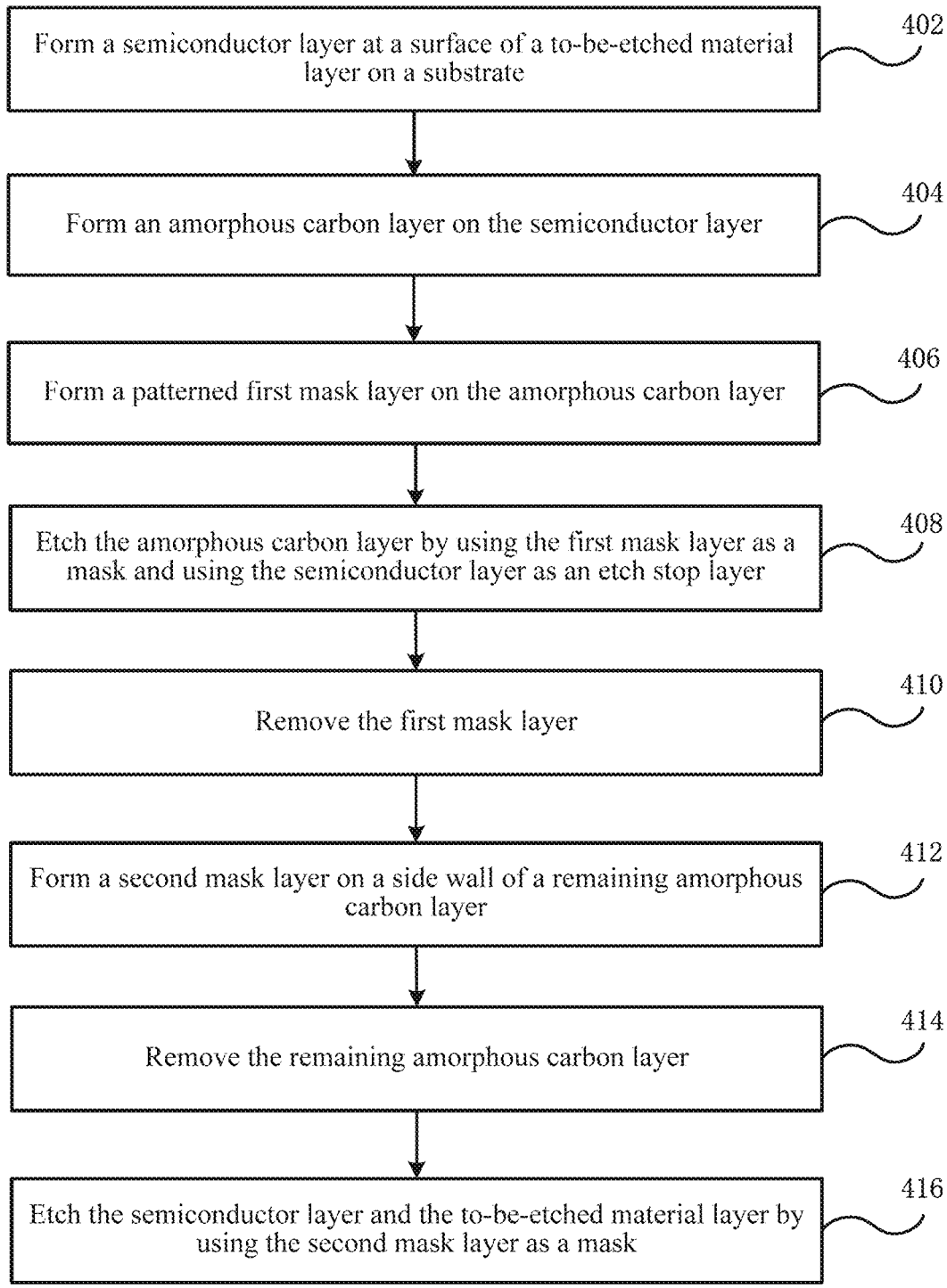
FIG. 4 is a schematic flowchart of another form a method for manufacturing a semiconductor structure.

FIG. 4 is a schematic flowchart of another form of a method for manufacturing a semiconductor structure. FIG. 5A to FIG. 5H show schematic diagrams at all phases of the method for manufacturing a semiconductor structure shown in FIG. 4. A method for manufacturing a semiconductor device according to still other forms of this application is described in detail below with reference to FIG. 4 and FIG. 5A to FIG. 5H.

Figure 5A:
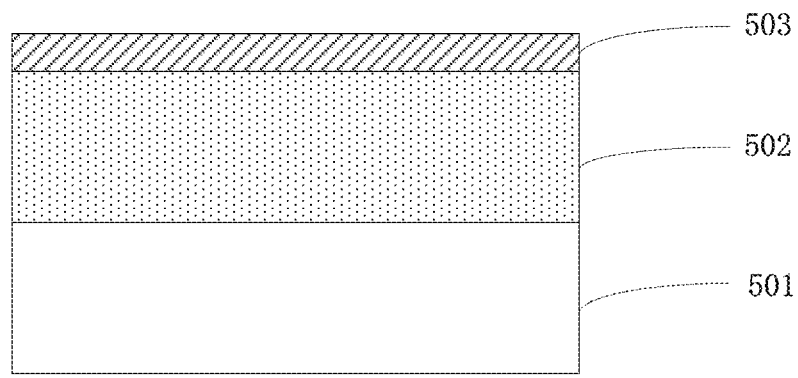
FIG. 5A to FIG. 5H show schematic diagrams at all phases of the form of the method for manufacturing a semiconductor structure shown in FIG. 4.
Figure 5B:
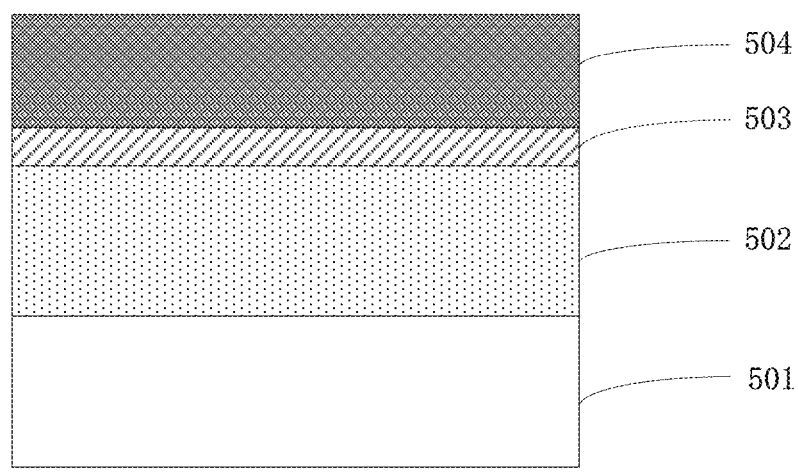

First, in step 402, a semiconductor layer 503 is formed at a surface of a to-be-etched material layer 502 on a substrate 501, as shown in FIG. 5A.

The to-be-etched material layer 502 may be, for example, a gate material layer. In some forms, a thickness of the semiconductor layer 503 is small with a thickness range between 1-5 nm, such as a thickness of 2 nm or 3 nm. In some implementations, the semiconductor layer 503 may include a silicon layer such as a monocrystalline silicon layer or an amorphous silicon layer. For manners of forming the silicon layer, reference may be made to the manners described above, and details are not described herein again.

Subsequently, in step 404, an amorphous carbon layer 504 is formed on the semiconductor layer 503, as shown in FIG. 5A. A thickness range of the amorphous carbon layer 504 may be approximately 10-1000 nm, with a thickness such as 30 nm, 50 nm, 100 nm, 500 nm, or 800 nm.

Figure 5C:
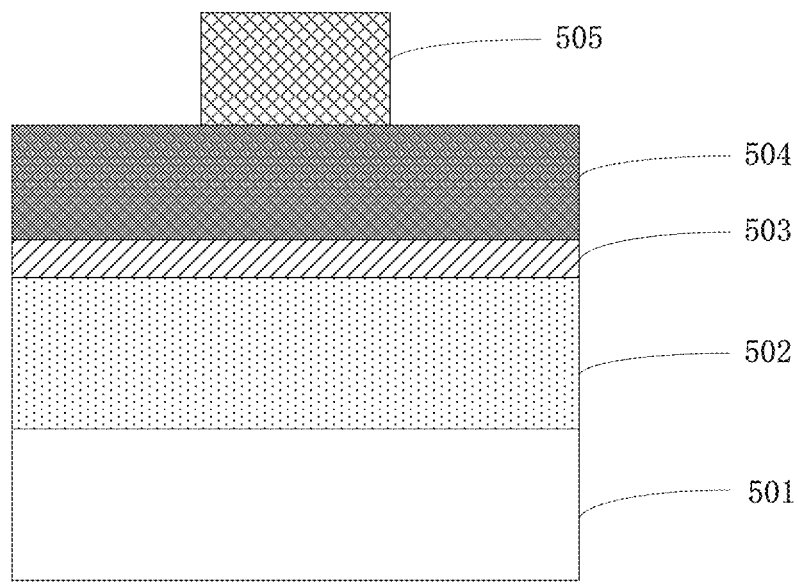

Subsequently, in step 406, a patterned first mask layer 505, for example, a photoresist, is formed on the amorphous carbon layer 504, as shown in FIG. 5C.

Figure 5D:
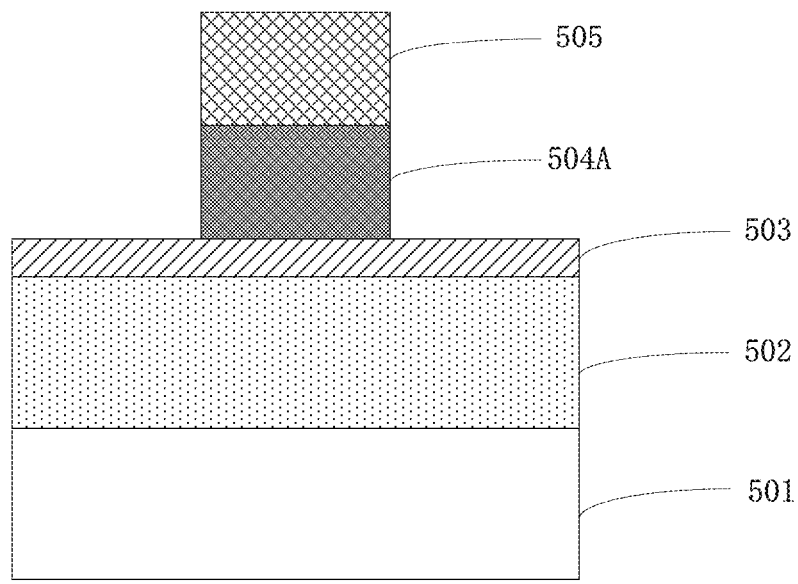

Subsequently, in step 408, the amorphous carbon layer 504 is etched using the patterned first mask layer 505 as a mask and using the semiconductor layer 503 as an etch stop layer, as shown in FIG. 5D. Herein, a remaining amorphous carbon layer 504A after the etching serves as a sacrificial layer and subsequently is removed.

Figure 5E:
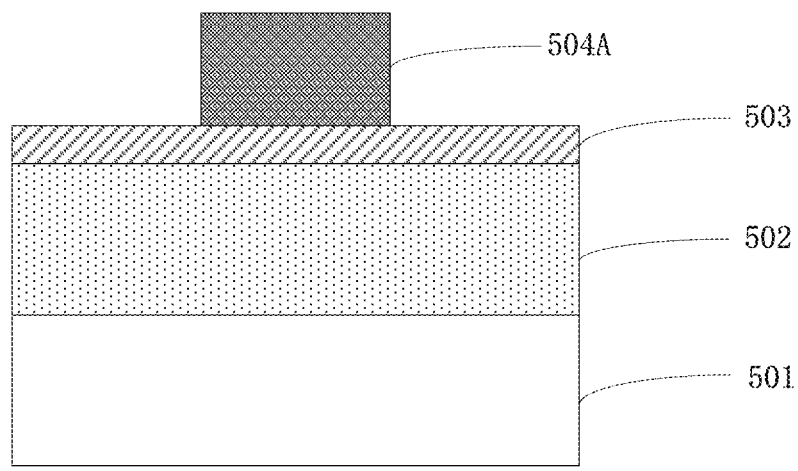

Subsequently, in step 410, the first mask layer is removed, as shown in FIG. 5E.

Figure 5F:
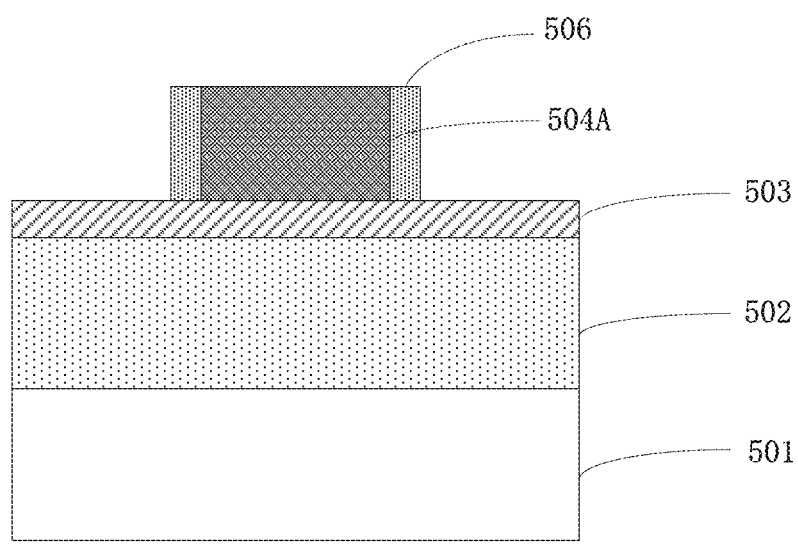

Subsequently, in step 412, a second mask layer 506 is formed on a side wall of the remaining amorphous carbon layer 504A, as shown in FIG. 5F. The second mask layer 506 may be, for example, a nitride of silicon.

In an implementation, a second mask material layer may be formed on an upper surface and a side wall of the remaining amorphous carbon layer 504A and on a surface of the semiconductor layer 503. Then, the second mask material layer on the upper surface of the remaining amorphous carbon layer 504A and on the surface of the semiconductor layer 503 is removed through anisotropic etching. The remaining second mask material layer is the second mask layer 506.

Figure 5G:
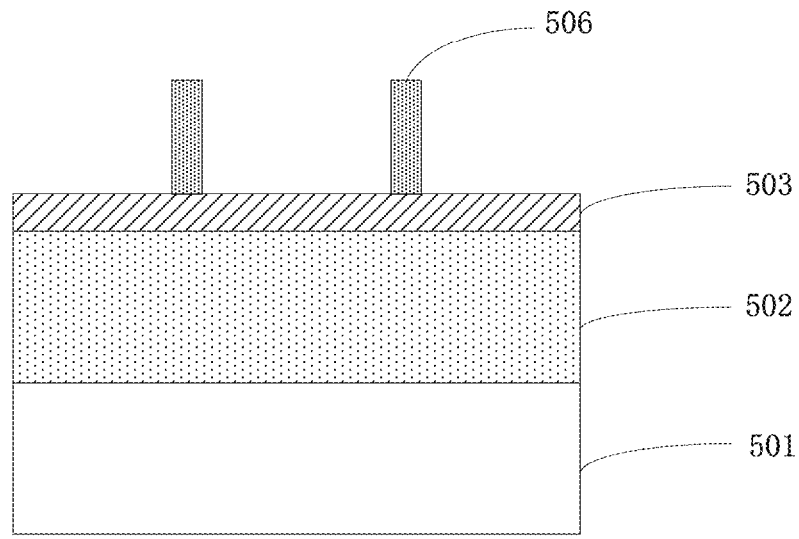

Subsequently, in step 414, the remaining amorphous carbon layer 504A is removed, as shown in FIG. 5G.

Figure 5H:
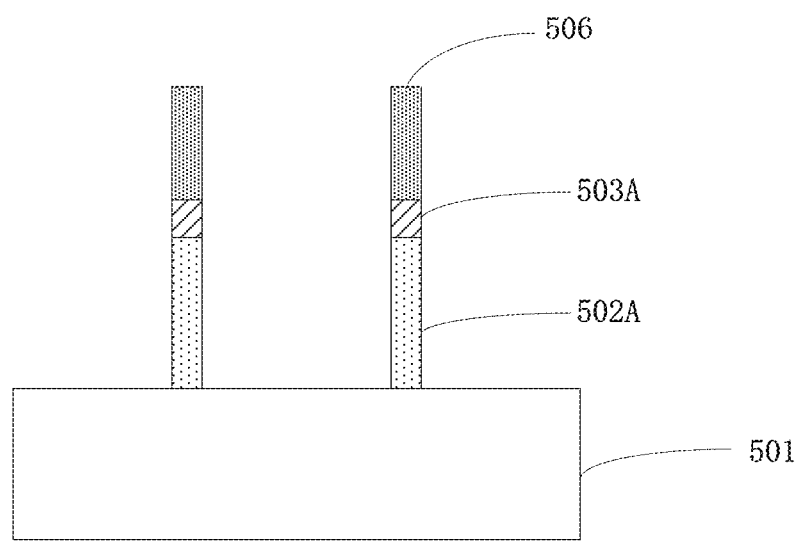

Subsequently, in step 416, the semiconductor layer 503 and the to-be-etched material layer 502 are etched using the second mask layer 506 as a mask, as shown in FIG. 5H.

For example, etching may be performed using the substrate 501 as an etch stop layer. Alternatively, a portion of the to-be-etched material layer 502 may be etched, so that the etching is stopped in the to-be-etched material layer 502.

For example, a semiconductor fin may be formed after the to-be-etched material layer 502 is etched. In such a manner, a semiconductor fin of a smaller size may be formed.

Subsequently, the second mask layer 506 may be removed. A remaining semiconductor layer 503A may also be optionally removed.

Forms of another method for manufacturing a semiconductor structure are described above. In the forms of the manufacturing method described above, a semiconductor layer is first formed before an amorphous carbon layer is formed, so that uniformity of the amorphous carbon layer is better. Because the amorphous carbon layer is more uniform, a position of a mask pattern of a first mask layer that is formed on a side wall of the amorphous carbon layer does not deviate from an expected position, and a shape of the mask pattern is also an expected shape. Further, a position of a pattern that is formed after the to-be-etched material layer is etched does not deviate from an expected position, and a shape of the pattern is an expected shape.

Heretofore, embodiments and forms of methods for manufacturing a semiconductor structure are described in detail. In describing the methods, some details generally known in the art are not described. According to the foregoing descriptions, a person skilled in the art may completely understand how to implement the technical solutions disclosed herein. In addition, the embodiments and forms according to the teaching disclosed in the specification may be freely combined. A person skilled in the art should understand that various amendments can be made to the embodiments and forms described above without departing from the scope and the spirit of this application that are defined by the appended claims.

What is claimed is:

1. A method for manufacturing a semiconductor structure, comprising:
   forming a semiconductor layer at a surface of a to-be-etched material layer on a substrate;
   after forming the semiconductor layer, forming an amorphous carbon layer on the semiconductor layer;
   forming a patterned mask layer on an upper surface of the amorphous carbon layer; and
   etching the amorphous carbon layer, the semiconductor layer, and the to-be-etched material layer using the patterned mask layer as a mask.

2. The method according to claim 1, wherein the semiconductor layer comprises a silicon layer.

3. The method according to claim 2, wherein the silicon layer comprises a monocrystalline silicon layer or an amorphous silicon layer.

4. The method according to claim 2, wherein:
   the silicon layer is formed through a direct current superposition plasma process;
   the silicon layer is formed by performing an ion injection on the surface of the to-be-etched material layer; or
   the silicon layer is formed through an atomic layer deposition process.

5. The method according to claim 4, wherein a source gas used by the direct current superposition plasma process includes nitrogen, argon, helium, hydrogen, or a carbonyl sulfide gas.

6. The method according to claim 1, wherein the to-be-etched material layer comprises an interlayer dielectric layer; and
   the interlayer dielectric layer is etched to form a contact hole passing through the interlayer dielectric layer.

7. The method according to claim 6, further comprising:
   removing the patterned mask layer;
   depositing a metal material to fill the contact hole; and
   performing a planarization process to remove a remaining amorphous carbon layer and a remaining semiconductor layer, so that an upper surface of a remaining metal material is approximately flush with an upper surface of the remaining to-be-etched material layer.

8. The method according to claim 1, wherein the to-be-etched material layer comprises a gate material layer; and
   the gate material layer is etched to form a gate.

9. The method according to claim 8, further comprising:
   removing the patterned mask layer, a remaining amorphous carbon layer, and a remaining semiconductor layer.

10. The method according to claim 1, wherein
    a thickness range of the semiconductor layer is between 1 nm and 5 nm; and
    a thickness range of the amorphous carbon layer is between 10 nm and 1000 nm.

* * * * *